United States Patent [19]
Darrow

[11] 4,009,454
[45] Feb. 22, 1977

[54] FAIL-SAFE CONSTANT AMPLITUDE SIGNAL GENERATOR

[75] Inventor: John O. G. Darrow, Murrysville, Pa.

[73] Assignee: Westinghouse Air Brake Company, Swissvale, Pa.

[22] Filed: June 26, 1975

[21] Appl. No.: 590,515

Related U.S. Application Data

[63] Continuation of Ser. No. 108,264, Jan. 21, 1971, abandoned.

[52] U.S. Cl. .............................. 331/117 R; 331/186
[51] Int. Cl.² .......................................... H03B 5/12
[58] Field of Search ........................ 317/146, 148.5; 331/117, 167, 168, 169, 170, 171, 186

[56] References Cited
UNITED STATES PATENTS

| 2,905,835 | 9/1959 | Wray | 331/117 |
| 3,072,862 | 1/1963 | Semeria et al. | 331/117 |
| 3,097,345 | 7/1963 | Ingram | 331/117 |

OTHER PUBLICATIONS

Foss et al., "Wireless World", p. 595, Dec. 1962.

*Primary Examiner*—John Kominski
*Attorney, Agent, or Firm*—J. B. Sotak; R. W. McIntire, Jr.

[57] ABSTRACT

This disclosure relates to a fail-safe constant amplitude signal generator including a shunt regulator for supplying d.c. operating potential to a free-running transistor oscillator as well as for controlling the quality factor of a resonant tuned circuit and, in turn, the oscillator so that an a.c. output signal is capable of being produced with a known amplitude which cannot be changed by any critical circuit or component failure.

10 Claims, 1 Drawing Figure

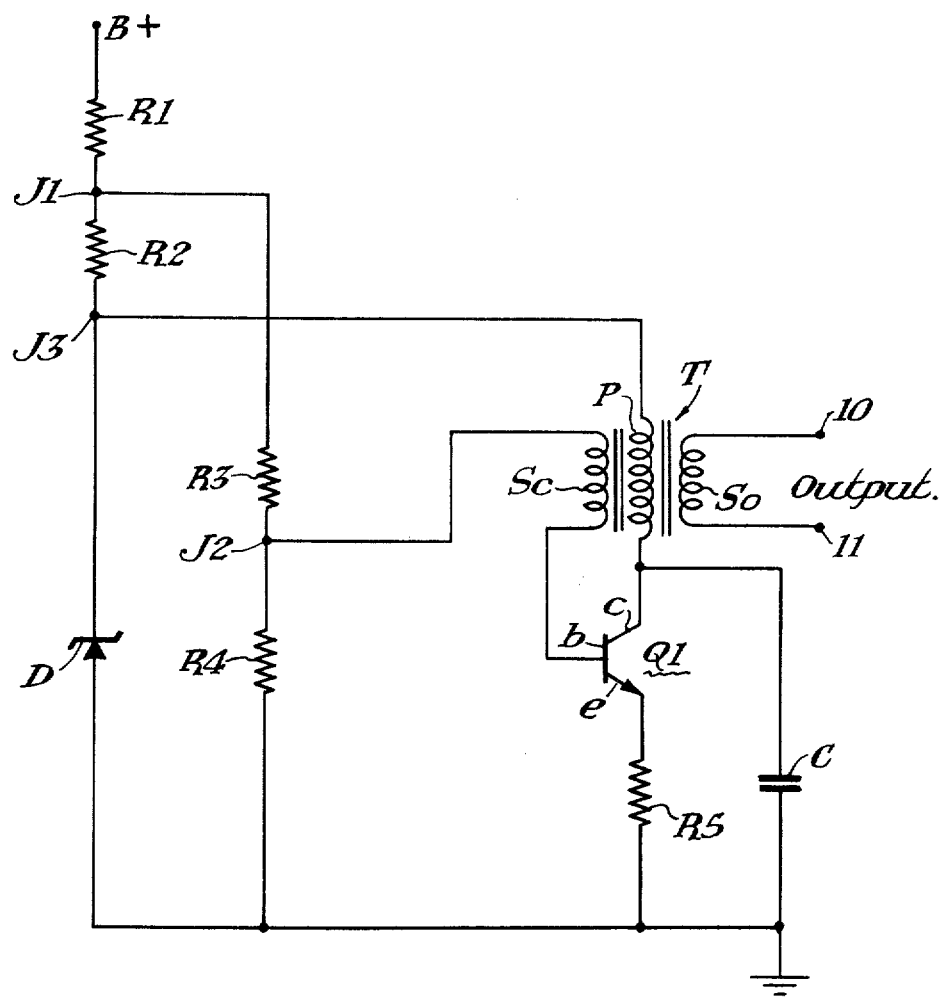

FAIL-SAFE CONSTANT AMPLITUDE SIGNAL GENERATOR

This is a continuation of application Ser. No. 108,264, filed Jan. 21, 1971 and now abandoned.

My invention relates to a fail-safe electronic circuit arrangement and more particularly to a constant amplitude signal generator having a free-running oscillator and a voltage regulator which regulates the supply potential and controls the quality factor of the oscillator so that a substantially constant a.c. output signal is produced when and only when no critical component or circuit failure is present and that no a.c. output signal is available during a critical component or circuit failure.

In various types of vital apparatus, such as highway or grade crossing equipment for railroads, it is necessary to provide a constant amplitude a.c. signal source for the transmitting portion of the grade or highway crossing warning equipment. In a train motion type of highway crossing detector, a transmitter and a receiver are connected in common to the opposite rails of a highway crossing track section. When no train is approaching the crossing, a constant signal is received by the receiver but no warning signal is produced so that it is safe for pedestrians and automotive vehicles to cross the railroad track. However, when a train or a railroad vehicle approaches the highway crossing, it is mandatory to warn the public against crossing the railroad track in order to forewarn them of the ensuing danger. The public is normally warned by the flashing of lights, by the ringing of bells and/or by the lowering of gate arms which are actuated when the train is at a point a predetermined distance from the crossing. When an approaching railroad vehicle reaches a predetermined point from the crossing, the signal induced into the track by the transmitter undergoes a change due to the motion of the train. The change in signal causes the receiver to produce an output signal which energizes the warning devices thereby alerting the public of the oncoming train. It will be appreciated that the amount of warning time given to the public is a function of signal change received by the receiver which is due to the speed or motion of the oncoming train. A safe warning distance or time is normally predicated upon the highest velocity at which a train will pass by the highway crossing. In order to ensure that sufficient warning time is given to the public, it is necessary to make certain that under no circumstance should the rate of signal change be produced by an apparatus failure. One cause which could adversely affect satisfactory operation arises if and when the amplitude of signal produced by the transmitter is inadvertently increased due to a circuit malfunction or a component failure. For example, an increase in the amplitude of the induced rail signal could simulate false train motion which could cause the public to believe that no moving train was in the vicinity of the highway crossing. Thus, it is a requirement that under no circumstances should the wayside transmitter be capable of increasing its signal level. To accomplish such operation, it is essential that the transmitter and particularly its a.c. signal generating circuit function in a fail-safe manner. That is, it is of utmost importance to ensure that a component or circuit failure is incapable of increasing the amplitude of the generated a.c. signals that are transmitted into the railroad track.

Accordingly, it is an object of my invention to provide a new and improved signal generating circuit which operates in a fail-safe manner.

A further object of my invention is to provide a fail-safe circuit arrangement which is incapable of increasing the amplitude of an a.c. output signal.

Another object of my invention is to provide a fail-safe signal generator which produces constant amplitude a.c. signals in the absence of a critical or component failure and no a.c. signals in the presence of a critical component or circuit failure.

Yet a further object of my invention is to provide a constant amplitude signal generator having a free-running oscillator and a voltage regulator.

Still another object of my invention is to provide a fail-safe electronic signal generating circuit including a tuned oscillating circuit having a tickler-coil for providing regenerative feedback and having a regulating device for controlling the quality factor of the oscillating circuit.

Yet a further object of my invention is to provide a fail-safe signal generator having a voltage regulator for supplying operating potential to a free-running oscillator.

Yet another object of my invention is to provide a unique signal generating circuit having a shunt regulator which includes a resistor for compensating for variations in the operating potential being supplied to a tuned oscillator as well as for impedance changes occuring in the shunt regulator.

Still a further object of my invention is to provide a fail-safe signal generating circuit arrangement including a tickler coil oscillator having a resonant circuit which is electrically connected in series with a Zener diode of a shunt regulator.

Still yet another object of my invention is to provide a fail-safe electronic signal generator which is ecomonical in cost, simple in construction, reliable in operation, durable in use and efficient in service.

In accordance with the present invention, the fail-safe constant amplitude signal generator employs a tuned oscillator and a shunt regulator. The oscillator includes a transistor amplifying stage having a tickler coil for providing regenerative feedback and having a resonant circuit for determining the frequency of oscillation. The shunt regulator includes a pair of series connected resistors one of which is connected to one terminal of a d.c. supply source and the other of which is connected to the cathode of a Zener diode. The anode of the Zener diode is connected to the other terminal of the d.c. supply source. One of the pair of resistors functions as a current limiting device while the other one resistor compensates for supply voltage fluctuations as well as for impedance variations occurring in the Zener diode. A voltage dividing network is connected from the junction point of the series connected resistors to the other of the d.c. supply terminals. The base electrode of the transistor of the amplifier is connected to the junction point of the voltage dividing network via a tickler coil which forms one secondary winding of a transformer. The primary winding of the transformer and a tuning capacitor form a resonant circuit, the junction point of which is connected to the collector electrode of the transistor. The other end of the tuning capacitor is connected to the other d.c. supply terminal while the other end of the primary winding is connected to the cathode of the Zener diode. A swamping or emitter degeneration resistor connects the emitter electrode of the transistor to the other terminal of the d.c. supply source. Thus, a constant amplitude output signal is derived from another secondary winding of the transformer when and only when no critical circuit or component failure is present.

The foregoing objects and other attendant features and advantages will be more readily appreciated as the subject invention becomes better understood by reference to the following detailed description when considered in conjunction with the accompanying drawing wherein:

The single FIGURE is a schematic circuit diagram of a fail-safe signal generator in accordance with the present invention.

Referring to the single FIGURE of the drawing, there is shown a preferred embodiment of the fail-safe electronic constant amplitude signal generating circuit of the present invention. As shown, the signal generating circuit comprises a shunt type voltage regulator for providing a substantially constant voltage source to a free-running oscillator having an active element in the form of NPN transistor Q1. The shunt regulator includes a pair of series connected resistors R1 and R2 and a breakdown device, such as a Zener diode D, connected across the terminals of a suitable source of d.c. supply voltage (not illustrated). As shown, the upper end of resistor R1 is connected to the terminal B+ of the supply source. The lower end of resistor R2 is connected to the cathode of Zener diode D while the anode of Zener diode D is connected to the common terminal or ground of the d.c. supply source. a voltage dividing network including a pair of series connected resistors R3 and R4 provides the biasing voltage for the amplifying stage including transistor Q1. For example, the upper end of resistor R3 is connected to junction point J1 of the series connected resistors R1 and R2 while the lower end of resistor R4 is directly connected to ground. The amplifying stage of the free-running oscillator includes the NPN transistor Q1 having a base electrode $b$, a collector electrode $c$, and an emitter electrode $e$. The base electrode $b$ of transistor Q1 is connected to junction point J2 between the voltage dividing resistors R3 and R4 through a tickler feedback coil Sc which is one of two secondary windings of transformer T. The emitter electrode $e$ of transistor Q1 is connected to ground via swamping resistor R5 which improves the stability of the circuit by providing degenerative feedback. A resonant circuit including a primary winding P of transformer T and a capacitor C determines the frequency of oscillations of the oscillator. One end of the capacitor C is connected to ground while the other end is connected in common with the collector electrode $c$ and the lower end of the primary winding P. The upper end of the primary winding P is connected to the junction J3 formed between the lower end of resistor R2 and the cathode of the Zener diode D. In the present case, the a.c. output signals generated by the oscillator are induced into a secondary winding So of the transformer T which provides isolation. As shown, a pair of output terminals 10 and 11 are connected to the respective ends of secondary winding So for providing connections to subsequent circuits, such as, to power amplifier stages or to some other utilization circuit or device.

Proceeding now with a detailed description of the operation of the signal generator according to the present invention, it will be assumed that all the connections have been appropriately made and that the circuit elements or components are intact and are operating in a proper manner. It has been found advantageous to optimize the circuit operation by selecting suitable values of resistances of resistors R2, R3, and R4, so that symmetrical clipping will result. Thus, oscillations will begin to occur in the circuit when power is applied and the normal biasing conditions are reached. It will be appreciated that the amplitude of the current flowing in the circuit will increase until a normal condition is reached due to the regenerative feedback coupled from the output circuit to the input circuit by the transformer windings. That is, the amount of feedback voltage induced in secondary winding Sc steadily increases as the output voltage in primary winding P increases due to the increase of current flowing therein. It will be appreciated the a.c. voltage is also induced in the secondary coil So so that a.c. output signals are present on terminals 10 and 11 when the oscillator is oscillating. Under normal conditions of operation, the Q of the series resonant circuit and, in turn, the Q of the oscillator, namely, the quality factor, is relatively high when the circuit resistance is relatively low. That is, when the Zener diode D is operating properly and goes into conduction, it exhibits a low dynamic impedance which allows a high quality factor to be maintained. Conversely, if an insufficient amount of supply voltage is applied to terminal B+, the Zener diode D will not break down and, therefore, it will exhibit a relatively high dynamic impedance so that the quality factor is relatively low and no oscillation will occur. As mentioned above, the d.c. operating point of the transistor amplifier is selected to be on the linear portion of the dynamic transfer characteristic curve. In fact, the parameters of the generator circuit are chosen such that the transistor is driven slightly into saturation, then to cutoff, then back to saturation, etc. Thus, a slight clipping effect occurs at the peak of each alternation of the a.c. output signal. It will be appreciated that the time it takes to change from saturation to cutoff is determined by the tank circuit, namely, the resonant circuit which, in turn, determines the frequency of oscillation.

As previously mentioned, the purpose of resistor R2 is to provide stable operation during periods when the potential on terminal B+ varies or when the Zener diode impedance changes. With the collector electrode $c$ connected to junction J3 by primary winding P and with the base electrode $b$ connected to junction J1 by secondary winding Sc and resistor R3, any variation in the supply voltage will cause a change in the potential levels on collector electrode $c$ as well as on base electrode $b$. It will be seen that as the voltage level of junction J1 rises, the base-emitter biasing voltage changes so that the amplifier is shifted off its optimum operating point which will cause a reduction in the level of a.c. output signals. It will be appreciated that it is advisable to select the optimum operating point at the minimum expected supply voltage in order to receive benefit of the compensation over full range of any expected power supply change. Further, it is understood that by selecting suitable values of resistors R1 and R2, the rate of change of the a.c. output produced by the effect of supply voltage variation on the Zener voltage and its impedance can be made substantially equal and opposite to the rate of change of a.c. output produced by shifting the amplifier off its otimum operating point. Similarly, if the supply voltage should decrease, which is an equally critical condition, the operating point is shifted toward its optimum operating point so that compensation is made for such a variation. Thus, by optimizing the operating point of the circuit at the minimum expected supply voltage, and by employing the resistor R2, the effects of the variation occurring in the supply voltage which result in Zener diode impedance changes will be negligible and an increase in the output signal level wil be reflected in the secondary winding So.

As previously mentioned, the signal generator operates in a fail-safe manner in that no critical circuit or component failure is capable of simulating a "true" condition by producing an erroneous output signal across secondary winding So. That is, if any of the components fail, either the d.c. supply potentials are removed or the a.c. operating characteristics of the transistor amplifier are destroyed. It will be seen that the short circuiting of the Zener diode D removes the necessary biasing and supply potentials from the circuit while an opencircuited condition destroys the oscillating ability of the circuit. In fail-safe operation, critical resistors cannot become short-circuited in that they are constructed of carbon composition material which can only become opencircuited. Thus, it will be seen that the opening of resistors R1, R2, R3, R4, and R5 will destroy the d.c. biasing conditions of the circuit or interrupt the a.c. signal path necessary for producing oscillations. It will be seen that the opening of any single winding will prevent oscillations from occurring. For example, if secondary winding Sc opens, no regenerative feedback occurs. If primary winding P opens, no voltage will be induced in either secondary winding Sc or secondary winding So. If secondary winding So opens, no output signal is available across the output terminals 10 and 11. Further, it will be appreciated that if a short appears between the turns of any winding, a decrease in output signal will occur due to the loading effect of the shorted turns and the loss of Q. If the capacitor C becomes open-circuited or short-circuited, the resonant circuit is interrupted or its resonance is destroyed, respectively. The opening of any electrode or the shorting between the electrodes destroys the amplifying characteristics of the transistor Q1 so that no output signal will be produced during such failures. Thus, it is apparent that the presently described signal generator operates in a fail-safe manner in that no critical circuit or component failure is capable of producing a false output signal across terminals 10 and 11, or allowing oscillations to continue in an unregulated mode.

Although an NPN transistor has been illustrated, it is understood that transistors of the opposite conductivity, namely, PNP transistors, may be used in the circuit with merely a polarlity reversal of the supply voltage and the Zener diode D. Similarly, while the present invention has been described in connection with a common-emitter transistor configuration, it is readily apparent that other transistor arrangements, namely, a common-base or a common-collector amplifier may be employed by merely arranging the input and output as is readily known to those skilled in the art. Similarly, it is apparent that the output may be taken from any convenient place on the circuit, such as from across the capacitor C or the like.

It will be appreciated that while this invention finds particular utility in highway or grade crossing equipment, it is readily evident that the invention is not merely limited thereto but may be employed in various systems and apparatus wherein similar requirements and conditions exist without departing from the spirit and scope of this invention.

It will also be apparent that other modifications and changes can be made in the presently described invention, and therefore it is understood that all changes, equivalents, and modifications within the spirit and scope of the present invention are herein meant to be included in the appended claims.

Having thus described my invention, what I claim is:

1. A constant amplitude signal generator which is capable of producing an a.c. output signal when no critical circuit failure is present and which is incapable of producing an a.c. output signal when a critical circuit failure is present comprising, a source of d.c. biasing potential, a shunt regulator connected across said source of d.c. biasing potential, said shunt regulator including a pair of series connected resistors connected in series with a Zener diode having an anode and cathode, an oscillator having a transistor including a base, an emitter and a collector electrode, a voltage divider network having a first and a second resistor connected between the anode of said Zener diode and the junction of said pair of series connected resistors, a resonant tank circuit including an inductor and capacitor electrically connected to said Zener diode, said inductor forming the primary winding of a transformer which includes a secondary feedback winding and a secondary output winding, said secondary feedback winding connected between the base electrode of said transistor and the junction of said first and second resistors of said voltage divider, said collector electrode of said transistor coupled to the junction of said inductor and said capacitor and said emitter electrode of said transistor resistively coupled to said source of d.c. biasing potential.

2. A fail-safe electronic circuit arrangement comprising a source of d.c. supply voltage, regulating means electrically connected to said source of d.c. supply voltage, oscillating circuit means having a resonant tank circuit means, a transformer coupled feedback circuit means and an output circuit means, said regulating means electrically connected to said resonant tank circuit means of said oscillating circuit means, and said regulating means employing its d.c. regulating characteristic for regulating the d.c. supply voltage applied to said oscillating circuit means and utilizing its a.c. dynamic impedance characteristic for controlling the quality factor of said resonant tank circuit means so that an output signal is produced in said output circuit means when said regulated means is operating properly and so that an output signal is incapable of being produced in said output circuit means for both conditions when said regulating means is shortcircuited as well as when said regulating means is opencircuited.

3. A fail-safe electronic circuit arrangement as defined in claim 2, wherein said regulating means includes a voltage breakdown device.

4. A fail-safe electronic circuit arrangement as defined in claim 3, wherein said voltage breakdown device is a Zener diode.

5. A fail-safe electronic circuit arrangement as defined in claim 2, wherein said oscillating circuit includes a tickler coil for providing regenerative feedback.

6. A fail-safe electronic circuit arrangement as defined in claim 2, wherin said regulating means is electrically connected to said oscillating circuit so that the quality factor Q of the circuit is decreased during failure of said regulating device.

7. A fail-safe electronic circuit arrangement as defined in claim 2, wherein said resonant tank circuit is a series circuit which determines the frequency of oscillation of said oscillating circuit.

8. A fail-safe constant amplitude signal source as defined in claim 2, wherein said oscillating circuit comprises a free-running transistor oscillator.

9. A fail-safe electronic circuit arrangement as defined in claim 4, wherein a resistor is connected in series with said Zener diode to compensate for variations in the impendance of said Zener diode and changes in the amplitude of said source of d.c. supply voltage.

10. A fail-safe electronic circuit arrangement as defined in claim 2, wherein said oscillating circuit includes an L-C resonant circuit in which the L component is the primary winding of a transformer having a secondary feedback winding and a secondary output winding.

* * * * *